United States Patent
Chen et al.

(10) Patent No.: US 8,808,853 B2
(45) Date of Patent: Aug. 19, 2014

(54) COATED ARTICLE AND METHOD FOR MAKING SAME

(75) Inventors: Wen-Rong Chen, New Taipei (TW);
Huann-Wu Chiang, New Taipei (TW);
Cheng-Shi Chen, New Taipei (TW);
Cong Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 254 days.

(21) Appl. No.: 13/238,169

(22) Filed: Sep. 21, 2011

(65) Prior Publication Data
US 2013/0029095 A1 Jan. 31, 2013

(30) Foreign Application Priority Data
Jul. 29, 2011 (CN) .......................... 2011 1 0215447

(51) Int. Cl.
*B32B 9/00* (2006.01)
*C23C 14/58* (2006.01)
*C23C 14/00* (2006.01)
*C23C 14/06* (2006.01)
*C23C 14/02* (2006.01)
*C23C 14/16* (2006.01)
*C23C 28/04* (2006.01)

(52) U.S. Cl.
CPC ............. *C23C 28/04* (2013.01); *C23C 14/5853* (2013.01); *C23C 14/0015* (2013.01); *C23C 14/0676* (2013.01); *C23C 14/022* (2013.01); *C23C 14/165* (2013.01)
USPC ........... 428/336; 428/216; 428/469; 428/472; 428/698

(58) Field of Classification Search
USPC .......................... 428/216, 336, 469, 472, 698
See application file for complete search history.

(56) References Cited

U.S. PATENT DOCUMENTS

| | | | | |
|---|---|---|---|---|
| 4,763,601 A | * | 8/1988 | Saida et al. ................... | 118/718 |
| 5,079,089 A | * | 1/1992 | Ito et al. ........................ | 428/336 |
| 5,427,843 A | * | 6/1995 | Miyajima et al. ............. | 428/469 |
| 2002/0192473 A1 | * | 12/2002 | Gentilhomme et al. ...... | 428/216 |
| 2007/0275264 A1 | * | 11/2007 | Hultin et al. .................. | 428/687 |
| 2008/0038579 A1 | * | 2/2008 | Schuisky et al. .............. | 428/640 |
| 2009/0181262 A1 | * | 7/2009 | Isaksson et al. .............. | 428/626 |

FOREIGN PATENT DOCUMENTS

JP   02-122064   *   5/1990

* cited by examiner

*Primary Examiner* — Archene Turner
(74) *Attorney, Agent, or Firm* — Novak Druce Connolly Bove + Quigg LLP

(57) ABSTRACT

A coated article includes a substrate, a color layer formed on the substrate and a ceramic layer deposited on the color layer. The color layer substantially includes metal Zn and O. The ceramic layer substantially includes substance M, O, and N, wherein M is Al or Si.

18 Claims, 2 Drawing Sheets

COATED ARTICLE AND METHOD FOR MAKING SAME

CROSS-REFERENCE TO RELATED APPLICATIONS

This application is one of the six related co-pending U.S. patent applications listed below. All listed applications have the same assignee. The disclosure of each of the listed applications is incorporated by reference into the other listed applications.

| Title | Inventors |
| --- | --- |
| COATED ARTICLE AND METHOD FOR MAKING SAME | HUANN-WU CHIANG et al. |
| COATED ARTICLE AND METHOD FOR MAKING SAME | HUANN-WU CHIANG et al. |
| COATED ARTICLE AND METHOD FOR MAKING SAME | HSIN-PEI CHANG et al. |
| COATED ARTICLE AND METHOD FOR MAKING SAME | WEN-RONG CHEN et al. |
| COATED ARTICLE AND METHOD FOR MAKING SAME | HSIN-PEI CHANG et al. |
| COATED ARTICLE AND METHOD FOR MAKING SAME | WEN-RONG CHEN et al. |

BACKGROUND

1. Technical Field

The exemplary disclosure generally relates to coated articles and a method for manufacturing the coated articles, particularly coated articles having a bone china appearance and a method for making the coated articles.

2. Description of Related Art

Vacuum deposition, anodic treatment and spray painting are used to form a thin film or coating on housings of portable electronic devices, to improve appearance of housings. The housings may be presented with a colorful appearance, but cannot present a high level of whiteness, brightness, and translucent appearance like a bone china.

The traditional formulation for the bone china contains about 25% kaolin, 25% Cornish stone and 50% bone ash. The bone ash for the bone china may be made from cattle bones having a lower amount of iron. The expensive cattle bones, the complex manufacturing process and the low yielding efficiency make bone china very expensive and thus not economically feasible in the construction of housings of portable electronic devices.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
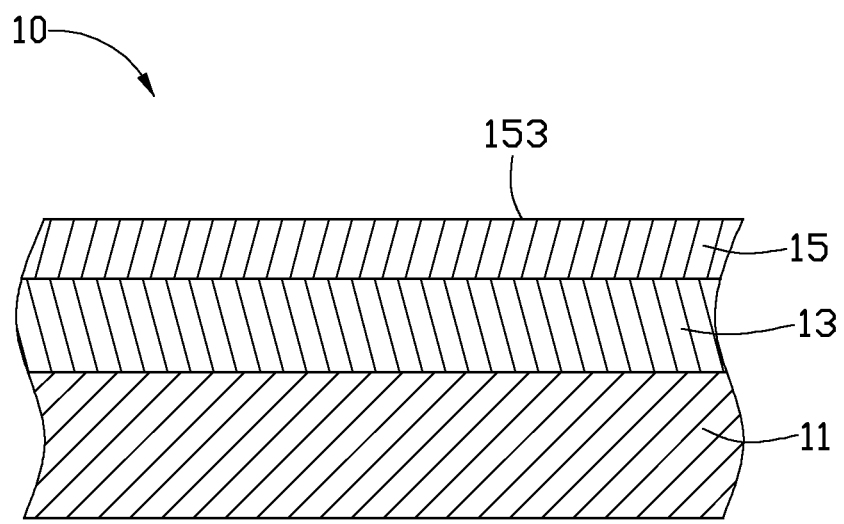
FIG. 1 is a cross-sectional view of an exemplary embodiment of coated article.

FIG. 1 shows an exemplary embodiment of a coated article. The coated article 10 includes a substrate 11, a color layer 13 formed on the substrate 11 and a ceramic layer 15 formed on the color layer 13. The coated article 10 may be a housing of a mobile phone, personal digital apparatus (PDA), note book computer, portable music players, GPS navigator, or digital camera.

The substrate 11 may be made of metal, such as stainless steel, aluminum, aluminum alloy, magnesium and magnesium alloy. The substrate 11 may also be made of nonmetal material, such as plastic.

The color layer 13 may be deposited by physical vapor deposition combined with oxygen heat-treatment. The color layer 13 consists essentially of substance zinc (Zn) or oxygen (O). In the color layer 13, the mass percentage of substance Zn is about 70-78%, the mass percentage of O is about 22-30%. The color layer 13 has a thickness of 5 µm-10µm. The color layer 13 has an L* value between about 85 to about 89, an a* value between about −0.5 to about 0.5, and a b* value between about −0.5 to about 0.5 in the CIE L*a*b* (CIE LAB) color space, so the color layer 13 is white.

The ceramic layer 15 is deposited by magnetron sputtering, vacuum evaporation or arc ion plating. The ceramic layer 15 consists essentially of substance M, oxygen (O) and nitrogen (N), wherein M is metal or nonmetal, such as aluminum (Al) or silicon (Si). When M is Al, the mass percentage of Al is about 60%-70%, the mass percentage of O is about 25%-28% and the mass percentage of N is about 2-15%. When M is Si, the mass percentage of Si is about 65%-75%, the mass percentage of O is about 17%-22% and the mass percentage of N is about 3%-18%. The mean particle diameter of the ceramic layer 15 is about 10 nm to about 15 nm. The ceramic layer 15 has an outer surface 153 away from the color layer 13. The surface roughness (Ra) of the outer surface 153 is about 10 nm to about 30 nm.

The ceramic layer 15 is transparent and colorless. The ceramic layer 15 has a thickness of about 2 µm to about 4 µm.

The color layer 13 combined with the ceramic layer 15 cause the coated article 10 to present a high level of whiteness, brightness and translucency appearance like bone china. The 60 degree specula gloss (Gs 60°) of the ceramic layer 15 is about 85-100. The coated article 10 measured from the ceramic layer 15 has an L* value between about 85 to about 89, an a* value between about −0.5 to about 0.5, and a b* value between about −0.5 to about 0.5 in the CIE L*a*b* (CIE LAB) color space, so the color layer 13 is white.

A method for manufacturing the coated article 10 may includes at least the following steps:

Providing a substrate 11. The substrate 11 may be made of metal, such as stainless steel, aluminum, aluminum alloy, magnesium and magnesium alloy. The substrate 11 may instead be made of nonmetal material, such as plastic.

Pretreating the substrate 11 by washing with a solution (e.g., alcohol or acetone) in an ultrasonic cleaner to remove impurities and contaminations, such as grease, or dirt. The substrate 11 is then dried.

The substrate 11 is then cleaned by argon plasma cleaning.

Figure 2:
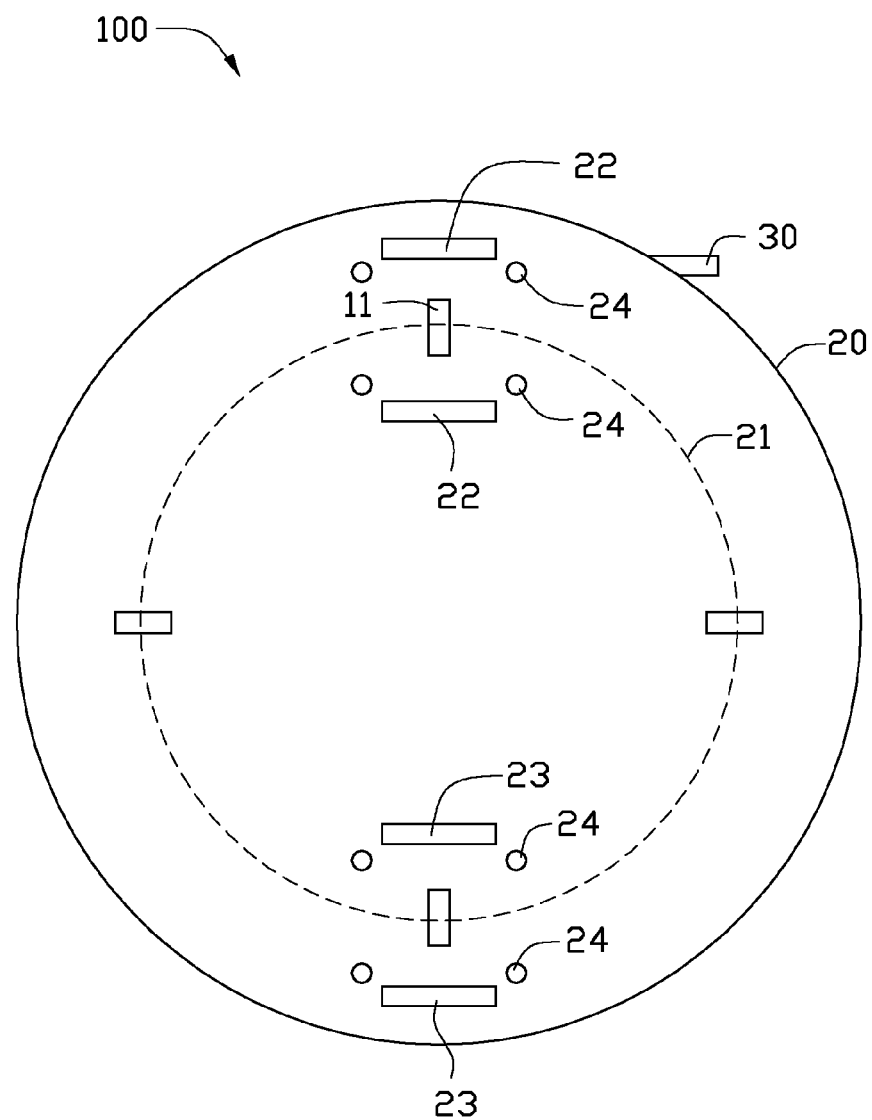
FIG. 2 is a schematic view of a vacuum sputtering coating machine for manufacturing the coated article of FIG. 1.

Providing a vacuum sputtering coating machine 100. Referring to FIG. 2, the vacuum sputtering coating machine 100 includes a sputtering coating chamber 20 and a vacuum pump 30 connected to the sputtering coating chamber 20. The vacuum pump 30 is used to evacuate the sputtering coating chamber 20. The vacuum sputtering coating machine 100 further includes a rotating bracket 21, two first targets 22, two second targets 23, and a plurality of gas inlets 24. The rotating bracket 21 rotates the substrate 11 in the sputtering coating chamber 20 relative to the first targets 22 and the second targets 23. The two first targets 22 face to each other, and are located on opposite sides of the rotating bracket 21, and the same arrangement applied to the two second targets 23. In this exemplary embodiment, the first targets 22 are made of Zn, the second targets 23 are made of Al, Al alloy, Si or Si alloy. If the second targets 23 are made of Al alloy or Zn alloy, the mass percent of the Al or Si is about 85%-90%.

Cleaning the substrate 11 by argon (Ar) plasma. The substrate 11 is retained on a rotating bracket 21 in a sputtering coating chamber 20. The vacuum level inside the sputtering coating chamber 20 is set to about $8.0*10^{-3}$ Pa. Argon gas is fed into the sputtering coating chamber 20 at a flux rate about 100 Standard Cubic Centimeters per Minute (sccm) to about 400 sccm from the gas inlets 24. A bias voltage applied to the substrate 11 may be between about −200 volts (V) and about −400 V. The argon particles strike against and clean the surface. Plasma cleaning the substrate 11 may take from about 3 minutes (min) to about 20 min.

Forming the color layer 13 on the substrate 11 includes the following steps:

First, depositing a Zn (zinc) layer (not shown) on the substrate 11. The internal temperature of the sputtering coating chamber 20 is maintained at about 300° C. to about 500° C. Argon may be used as a working gas and is injected into the sputtering coating chamber 20 at a flow rate from about 100 sccm to about 300 sccm. The first targets 22 in the sputtering coating chamber 20 are evaporated at a power about 2 kW to about 3 kW. The substrate 11 may have a negative bias voltage about −100 V to about −200 V to deposit the Zn layer on the substrate 11. Depositing of the Zn layer may take from about 1 hour to about 2 hours.

Second, treating the Zn layer by heat treatment in an oxygen atmosphere. Injecting argon into the sputtering coating chamber 20 is stopped, and the first targets 22 are closed. The internal temperature of the sputtering coating chamber 20 is maintained at about 300° C. to about 500° C. Oxygen ($O_2$) is injected into the sputtering coating chamber 20 at a flow rate from about 80 sccm to about 150 sccm, to heat the Zn layer for about 20 min to about 1 hour. During the heat treatment, Zn in the Zn layer completely oxidizes to Zinc oxide (ZnO).

The color layer 13 has an L* value between about 85 to about 89, an a* value between about −0.5 to about 0.5, and a b* value between about −0.5 to about 0.5 in the CIE L*a*b* (CIE LAB) color space, so the color layer 13 is white.

Because use the oxygen as reactive gas and the Zn targets as targets to depositing the color layer 13 directly, it is difficult to make sure the atomic number ratio of Zn and O is about 1:1. Thus, the color layer 13 directly deposited on the substrate 11 can not presented to be white. However, the heat treatment can oxidize the O to ZnO, so that the color layer 13 may be presented to be white.

A ceramic layer 15 is deposited on the color layer 13. The temperature in the sputtering coating chamber 20 is set between about 20° C. (Celsius degree) and about 200° C. Argon may be used as a working gas and is injected into the sputtering coating chamber 20 at a flow rate from about 100 sccm to about 300 sccm. Nitrogen ($N_2$) and oxygen ($O_2$) may be used as reaction gases. The nitrogen may have a flow rate of about 80 sccm to about 200 sccm, the oxygen may have a flow rate of about 80 sccm to about 200 sccm. The first targets 22 in the sputtering coating chamber 20 are evaporated at a power between about 5 kW and about 10 kW. A bias voltage applied to the substrate 11 may be between about −100 volts and about −300 volts, for between about 50 minutes and about 80 minutes, to deposit the ceramic layer 15 on the color layer 13. The ceramic layer 15 has a thickness of about 1 μm to about 2 μm.

Polishing the outer surface 153 to increase glossiness and transparency of the ceramic layer 15. Providing a finishing and polishing machine (not shown). The finishing and polishing machine includes a canvas polishing wheel. Polishing fluid is coated on the outer surface of the canvas polishing wheel to polish the ceramic layer 15 for about 10 min to about 15 min. The polishing fluid is a suspension, which substantially comprises alumina powder and water. The 60 degree specula gloss (Gs 60°) of the second layer 15 is about 85-100 after the polishing process. The surface roughness (Ra) of the outer surface 153 is about 10 nm to about 30 nm.

It is to be understood that the ceramic layer 15 may also be made by vacuum evaporation or arc ion plating.

The coated article 10 manufactured by the method present a bone china appearance. The method of the coated article 10 is simpler, can be produced at further higher productivity and lower cost relative to the method of the typical bone china products. The coated article 10 may be widely used in many fields (e.g., electronic products, automobiles and houseware articles) as the coated article 10 can be mass production on an industrial scale. Additionally, the substrate 11 can be made of stainless steel, Al, Al alloy, Mg, Mg alloy or plastic can improve the toughness of the coated article 10. Thus, the improvement in toughness of the coated article 10 can cause the coated article 10 to have outstanding anti-fragility properties. Furthermore, when the substrate 11 is made of light metal (e.g., Al, Al alloy, Mg and Mg alloy) or plastic can cause the coated article 10 more lightly relative to the typical bone china products.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
    a substrate;
    a color layer formed on the substrate, the color layer consisting essentially of substance Zn and O, wherein in the color layer, the mass percentage of Zn is about 70-78% and the mass percentage of O is about 22-30%; and
    a ceramic layer deposited on the color layer, the ceramic layer consisting essentially of substance M, O and N, wherein M is Al or Si.

2. The coated article as claimed in claim 1, wherein the color layer has an L* value between about 85 to about 89, an a* value between about −0.5 to about 0.5, and a b* value between about −0.5 to about 0.5 in the CIE L*a*b* color space.

3. The coated article as claimed in claim 1, wherein M is Al, the mass percentage of Al is about 60%-70%, the mass percentage of O is about 25%-28% and the mass percentage of N is about 2%-15%.

4. The coated article as claimed in claim 1, wherein M is Si, the mass percentage of Si is about 65%-75%, the mass percentage of O is about 17%-22% and the mass percentage of N is about 3%-18%.

5. The coated article as claimed in claim 1, wherein the average particle diameter of the ceramic layer is about 10 nm to about 15 nm.

6. The coated article as claimed in claim 1, wherein the ceramic layer comprises an outer surface away from the color layer, the surface roughness (Ra) of the outer surface is about 10 nm to about 30 nm.

7. The coated article as claimed in claim 1, wherein the color layer has a thickness of 5 μm to about 10 μm.

8. The coated article as claimed in claim 1, wherein the ceramic layer has a thickness of 2 μm to about 4 μm.

9. The coated article as claimed in claim 1, wherein the ceramic layer is transparent and colorless.

10. The coated article as claimed in claim 1, wherein the 60 degree specula gloss of the ceramic layer 15 is about 85-100.

11. The coated article as claimed in claim 1, wherein the coated article 10 has an L* value between about 85 to about 89, an a* value between about −0.5 to about 0.5, and a b* value between about −0.5 to about 0.5 in the CIE L*a*b* color space.

12. The coated article as claimed in claim 1, wherein the substrate is made of material selected from one of stainless steel, aluminum, aluminum alloy, magnesium, magnesium alloy and plastic.

13. A method for manufacturing an article comprising:
providing a substrate;
forming the color layer on the substrate including follow steps: depositing a zinc layer on the substrate, during deposition of the zinc layer, the first targets being made of zinc; and treating the Zn layer by heat treatment in an oxygen atmosphere, thereby creating the color layer consisting essentially of substance Zn and O, wherein in the color layer, the mass percentage of Zn is about 70-78% and the mass percentage of O is about 22-30%;
depositing a ceramic layer on the color layer, the ceramic layer comprises a outer surface away from the color layer, the ceramic layer consisting essentially of substance M, O and N, wherein the M is Al or Si, during deposition of the ceramic layer, $N_2$ and $O_2$ being used as reaction gases, the second targets being made of Al, Al alloy, Si or Si alloy;
polishing the outer surface of the ceramic layer.

14. The method of claim 13, wherein during deposition of Zn layer, the substrate is retained in a sputtering coating chamber of a vacuum sputtering coating machine; the temperature in the sputtering coating chamber is set between about 20° C. and about 200° C.; argon is fed into the sputtering coating chamber at a flux between about 100 sccm and about 300 sccm, the second targets in the sputtering coating chamber are evaporated at a power between about 2 kW and about 3 kW; a bias voltage applied to the substrate is between about −100 volts and about −300 volts for between about 1 hour and about 2 hours, to deposit the zinc layer on the substrate.

15. The method of claim 13, wherein during the heat treatment, the substrate is retained in a sputtering coating chamber of a vacuum sputtering coating machine; injecting argon into the sputtering coating chamber is stopped, and the first targets are closed, the internal temperature of the sputtering coating chamber is maintained at about 300° C. to about 500° C., oxygen is injected into the sputtering coating chamber at a flow rate from about 80 sccm to about 150 sccm, to heat treatment the zinc layer for about 20 min to about 1 hour.

16. The method of claim 13, wherein when the second targets are made of Al alloy or Zn alloy, the mass percent of the Al or Si is about 85-90%.

17. The method of claim 13, wherein during deposition of the ceramic layer on the substrate, the substrate is retained in a sputtering coating chamber of a vacuum sputtering coating machine; the temperature in the sputtering coating chamber is set between about 20° C. and about 200° C.; argon is fed into the sputtering coating chamber at a flux between about 100 sccm and about 300 sccm, nitrogen is fed into the sputtering coating chamber at a flux between about 80 sccm and 200 sccm and oxygen is fed into the sputtering coating chamber at a flux between about 80 sccm and 200 sccm; the second targets in the sputtering coating chamber are evaporated at a power between about 5 kW and about 10 kW; a bias voltage applied to the substrate is between about −100 V and about −300 V for between about 50 minutes and about 80 minutes, to deposit the ceramic layer on the color layer.

18. The method of claim 13, wherein during polishing the outer surface of the ceramic layer, the outer surface is polished by a canvas polishing wheel with polishing fluid for about 10 min to about 15 min, the polishing fluid is a suspension which substantially comprises alumina powder and water.

* * * * *